United States Patent [19]

Ferguson

[11] Patent Number: 5,185,042
[45] Date of Patent: Feb. 9, 1993

[54] GENERIC SOLAR CELL ARRAY USING A PRINTED CIRCUIT SUBSTRATE

[75] Inventor: David L. Ferguson, Manhattan Beach, Calif.

[73] Assignee: TRW Inc., Redondo Beach, Calif.

[21] Appl. No.: 739,594

[22] Filed: Aug. 1, 1991

[51] Int. Cl.[5] .................................. H01L 31/05
[52] U.S. Cl. ......................... 136/244; 174/250; 174/251; 174/260
[58] Field of Search ................ 136/244; 174/250, 251, 174/260

[56] References Cited

U.S. PATENT DOCUMENTS

| 3,376,164 | 4/1968 | Bachwansky | 136/251 |
|---|---|---|---|
| 3,454,774 | 7/1969 | Wizenick | 136/244 |
| 3,466,198 | 9/1969 | Webb | 136/244 |
| 3,553,030 | 1/1971 | Lebrun | 136/244 |
| 4,019,924 | 4/1977 | Kurth | 136/251 |
| 4,131,755 | 12/1978 | Keeling et al. | 136/244 |
| 4,154,998 | 5/1979 | Luft et al. | 219/10.49 R |
| 4,173,820 | 11/1979 | Mueller et al. | 437/2 |
| 4,203,646 | 5/1980 | Desso et al. | 339/205 |
| 4,577,051 | 3/1986 | Hartman | 136/244 |
| 5,021,099 | 6/1991 | Kim | 136/249 |
| 5,091,018 | 2/1992 | Fraas et al. | 136/246 |
| 5,096,505 | 3/1992 | Fraas et al. | 136/746 |

FOREIGN PATENT DOCUMENTS

| 1522618 | 8/1978 | United Kingdom | 136/244 |
|---|---|---|---|
| 2040562 | 8/1980 | United Kingdom | 136/244 |

*Primary Examiner*—Aaron Weisstuch
*Attorney, Agent, or Firm*—G. Gregory Schivley; Sol L. Goldstein

[57] ABSTRACT

There is disclosed a generic solar array panel which utilizes a printed circuit substrate. A series of electrically conductive paths for interconnecting the solar cells and other electronic components to form a solar electric power supply network is formed on or encapsulated into the substrate. An integral bus line conducts the collected power to a load. Stress relief loops routed in the substrate compensate for differences in characteristics of thermal expansion between the solar cell and the substrate while maintaining the integrity of the network's electrical connections.

20 Claims, 3 Drawing Sheets

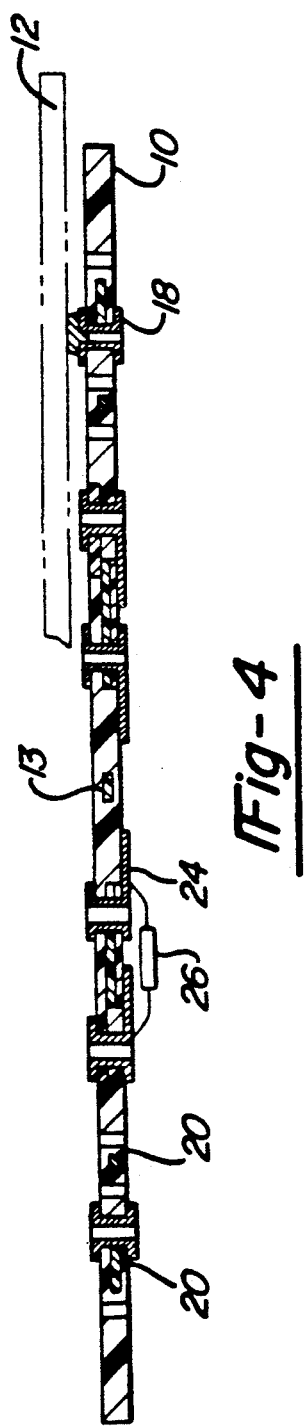
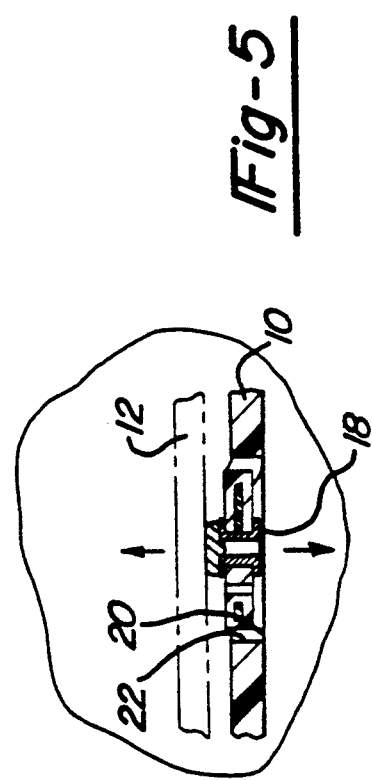

GENERIC SOLAR CELL ARRAY USING A PRINTED CIRCUIT SUBSTRATE

BACKGROUND AND SUMMARY OF THE INVENTION

The invention relates generally to solar panels and, more particularly, to a generic solar array panel which utilizes a printed circuit substrate.

A conventional solar array panel has a multiplicity of solar cells mechanically mounted to an aluminum honeycomb panel, or other substrate, and electrically connected to each other using small metallic interconnectors to result in a solar power supply network. The solar cells and their accompanying circuitry transform sunlight into electrical energy, the voltage of which is controlled by the number of solar cells connected in electrical series. Maximum solar power output for a panel of a given size is achieved by maximizing the packing density of the solar cells on the exposed area of the substrate.

The manner in which the solar cells are physically and electrically arranged is normally custom designed for each application and depends on such factors as the substrate dimensions, the electrical requirements of the completed solar array, and the requirements for other electronic components such as protective blocking and shunting diodes necessary to prevent major or total array failure in the event of an electrical short developing in a solar cell string, failure of a solar cell, or shadowing of a portion of the solar array. Constructing such solar array panels while maximizing power output and minimizing panel size, weight, and cost presents several difficulties to which this invention is addressed.

A main difficulty involves making and maintaining the large number of electrical connections required between the individual solar cells as well as between the solar cells and other electronic components in the network. Conventionally, these connections are made with small metallic, often foil, tabs which must be soldered on individually and which may be quite fragile. This results in a solar array panel with a costly, labor-intensive construction process as well as with less than optimal reliability.

Also, conventional solar cells often have their positive and negative terminals on opposite sides of the cell. Therefore, a shingle-like assembly for series interconnection of the positive terminal of one cell to the negative terminal of the next is often employed. This shingled arrangement, in combination with the delicate metallic interconnectors, causes complications in the rework or replacement of one or more broken or dysfunctional cells on a panel. Moreover, this type of assembly is inefficient as portions of each cell are covered by an adjacent cell and results a needlessly high number of solar cells and in unnecessary panel weight.

Present solar panel designs further require hard wiring to conduct the collected electrical power to the load. Electrical harnesses are often routed and bonded to the back side of the substrate, necessitating feedthrough holes from the solar cells on the front to the back side. Routing and bonding these wires likewise can be labor intensive and lead to complicated rework and repair.

It is, therefore, an object of the present invention to provide a relatively low cost and reliable solar panel that is simple to construct and repair. It is also an object to provide means for maximizing the packing density of the solar cells on the panel in order to maximize power output while minimizing panel size and weight. This is especially important for solar panels used in satellite and spacecraft applications wherein optimum utilization of available solar array substrate area is essential.

Finally, it is an object of the present invention to provide a generically designed substrate and circuit means, adaptable to virtually any customized panel design for given power requirements.

The foregoing and other objects of the present invention have been attained by providing a generic printed circuit substrate onto which the solar cells and other electronic components are mounted. Formed on the substrate, or encapsulated therein, are all of the cell to cell interconnections as well as connections between the cells and other circuit elements. An integral bus line, also encapsulated within or formed on the substrate, eliminates the need to hardwire the collected power to the load.

Electrically conductive interconnect pads are provided on the substrate top, or exposed, surface for physically mounting the solar cells onto the substrate as well as facilitating their electrical series interconnection, thereby eliminating shingle-like assembly and simplifying rework and repair or broken or dysfunctional cells. Electrically conductive mounting pads for blocking and shunt diodes are provided on the back side of the substrate so that these components can be easily mechanically and electrically connected to the solar array panel. This enables maximum packing densities of the solar cells on the panel as the entire top surface of the solar panel is available for solar cell layout.

The interconnect substrate circuitry is generally designed such that a multiplicity of solar cells are connected in electrical series. Design options of ending a series string at any given location are provided by enabling the series connection between two adjacent cell locations to be interrupted by punching out a small area of the substrate at that location. Cross hatches or other marks can be printed on either of the substrate surfaces to indicate the area of the substrate to be punched out.

Another feature of the preferred embodiment of this invention provides the ability to reliably mount, by soldering or other like process, the silicon solar cells to a printed circuit substrate. This is accomplished by routing stress relief loops into the circuit substrate. The stress relief loops allow the interconnect pads onto which the solar cells are mounted to move relative to the rest of the substrate. This relieves the stress to the solder joint created by differences in the characteristics of thermal expansion between the solar cell and the printed circuit substrate.

Additional objects, advantages, and features of the present invention will become apparent from the following description and appended claims, taken in conjunction with the accompanying drawings.

BRIEF DESCRIPTION OF THE DRAWINGS

FIG. 4 is a detailed cross-sectional view taken generally along line 4—4 of FIG. 3.

FIG. 5 is an enlarged detailed view showing the freedom of movement of the interconnect pads relative to the remainder of the substrate.

DESCRIPTION OF THE PREFERRED EMBODIMENT

Figure 1:
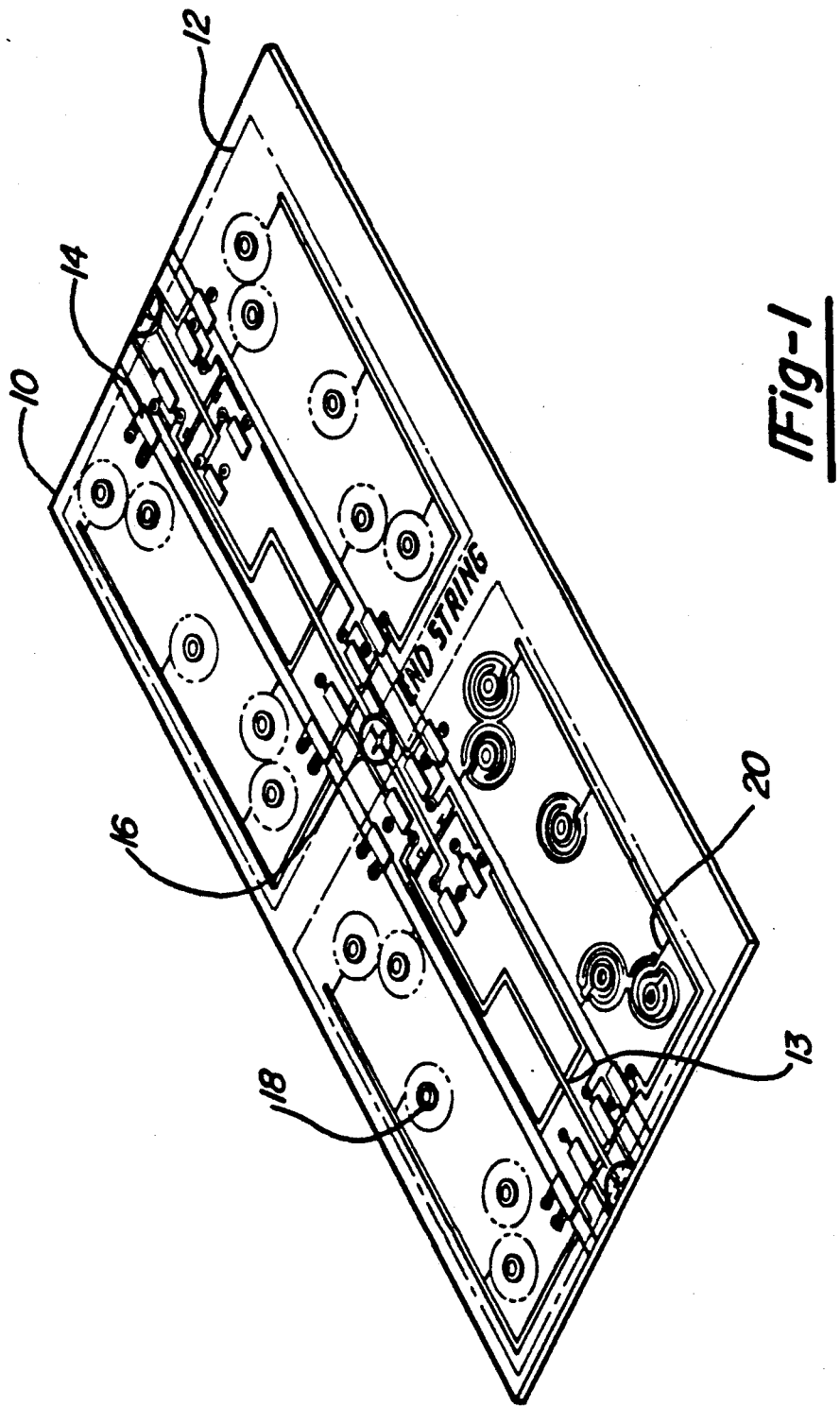
FIG. 1 is a perspective view of a portion of a solar array panel according to the present invention wherein the solar cells are shown in phantom.

The preferred embodiment of one portion of the solar panel according to the present invention is generally shown in FIGS. 1-5 of the drawings wherein like numerals are used to refer to like elements throughout. As can be seen in FIG. 1, the solar panel generally comprises a substrate 10, a rectangular sheet of epoxy glass in this exemplary embodiment, having mounted to one surface thereof a plurality of solar cells 12 (shown in phantom) preferably arranged in an array of coplanar parallel rows. The substrate 10 has formed thereon a plurality of solar electric power supply conductors defining a network 13 which includes an integral bus line 14 for conducting collected electrical power to the load. The conductive paths of the network 13 connect the solar cells to each other as well as to other electronic components in the circuit. In a preferred embodiment, the substrate 10 may be comprised of a multiplicity of layers, each layer having at least one of said conductive paths printed thereon by a photolithographic process or other such known process to encapsulate the networks. Also, the substrate can comprise top or bottom conductive layers forming the network path 13.

A generic solar electric power distribution network is formed by electrically connecting all of the solar cells in a given row in electrical series. To provide a customized circuit design formed of solar cells strings wherein each string comprises a preselected number of cells connected in series, the rows of cells can be interrupted electrically by punching out the marked circled portions 16, or other similar indicators, printed on a surface of the substrate. For example, connections may be ended between two adjacent solar cells 12 by physically removing or punching out the portion 16 of the substrate 10 having formed thereon (or encapsulated therein) the series connection between the two cells.

Figure 2:
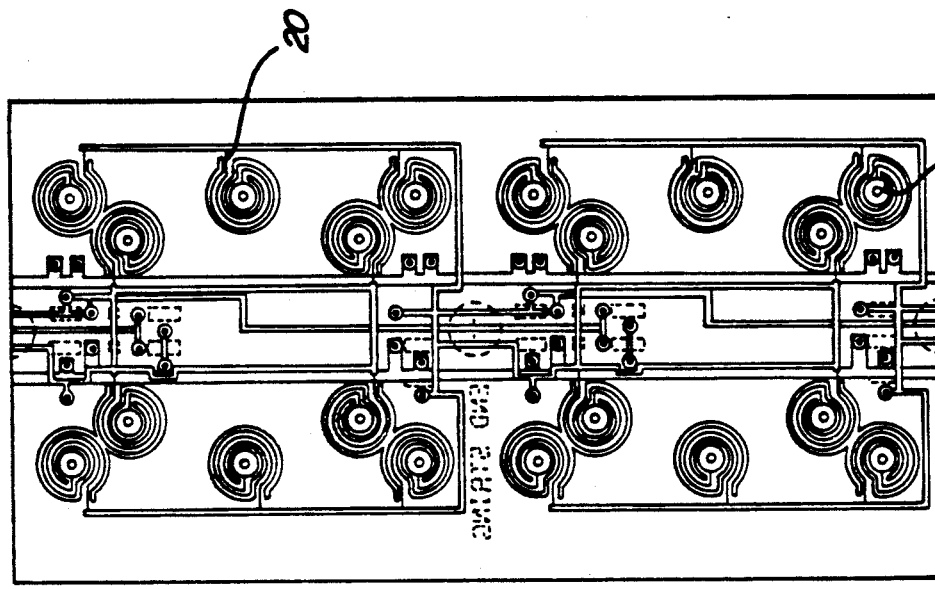
FIG. 2 is a plan view of the top surface of the printed circuit substrate.
Figure 3:
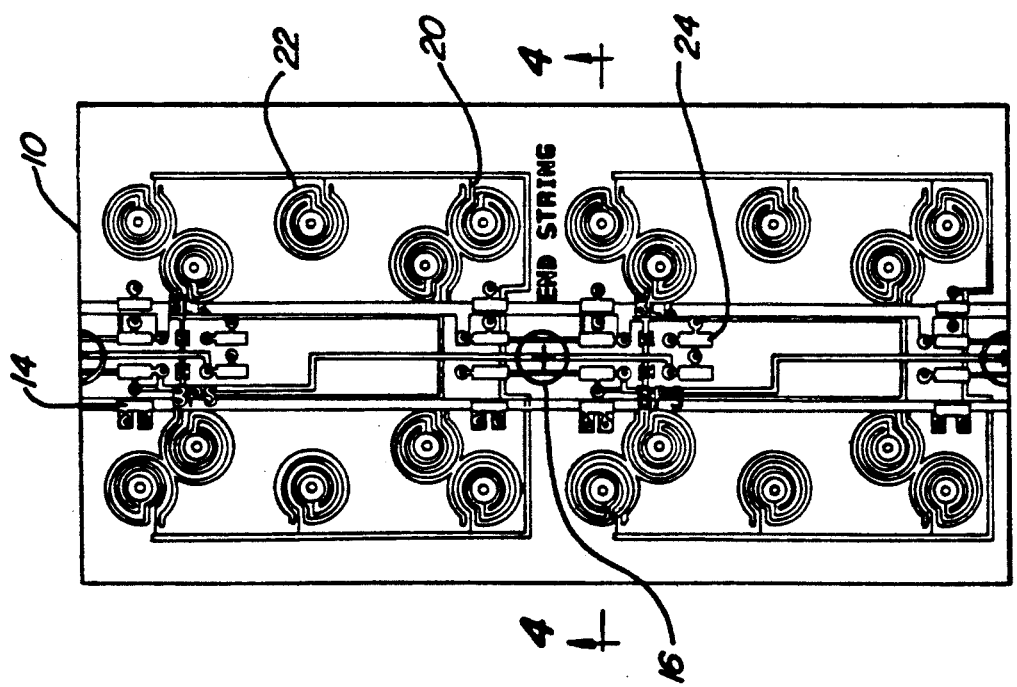
FIG. 3 is a plan view of the bottom surface of the printed circuit substrate.

The solar cells 12 are physically connected to the substrate 10, as well as electrically connected to the power supply network 13, via electrically conductive interconnect pads 18. Positive and negative terminals of the cells are connected, preferably by soldering, to interconnect pads 18. In this exemplary embodiment as best shown in FIGS. 2 and 3, a group of ten interconnect pads 18 is provided to accept ten terminals from each solar cell 12. However, the number and configuration of groups of interconnect pads 18 would be wholly dependent upon the exact type of solar cell to be used.

Preferably, solar cells 12 are of a type having plated-through holes wherein both the positive and negative terminals are accessible from one side of the cell. If more conventional cells are used, wherein the positive and negative terminals are accessible only from opposite sides of the cell, small metallic or other interconnections can be connected from terminals on the top side of cell, over the cell edge, to the interconnect pads. Although using metallic interconnectors is less desirable, both configurations eliminate a shingle-like assembly of cells and allow each cell to be individually removably connected to the substrate and not to each other, thereby simplifying panel construction, rework, and repair processes and maximizing packing densities. Optionally, adhesive may be used to further mechanically and thermally secure the solar cells to the substrate 10.

Electrical traces 20 connect the interconnect pads 18 to the network 13. In a preferred embodiment, these traces 20 are encapsulated within substrate 10 and pass almost 360 degrees around interconnect pads 18 before intersecting the remainder of the network. Stress relief loops 22, consisting of arcuate routed slots in substrate 10, bound interconnect pads 18 and traces 20. The configuration of the traces 20 and the stress relief loops 22 in this exemplary embodiment allows the interconnect pads 18 to move relative to the remainder of substrate 10 and results in the solar cells being effectively mounted to substrate 10 on a series of coil springs as best shown in FIG. 5. This mounting configuration compensates for differences in the characteristics of thermal expansion between the substrate 10 and the solar cells 12 while maintaining the integrity of the electrical connections to and between the solar cells. Alternatively, stress release loops 22 of other geometric configurations could be used.

On the back side of substrate 10, or the surface opposite the solar cells 12, there is provided electrically conductive mounting pads 24 to enable attachment and electrical connection of other circuit elements such as blocking and shunting diodes 26 to the network.

The back mounting of the pads 24 makes it possible to automatically interconnect the circuit elements such as diodes, to the electrical network 13. This avoids the need to hardwire and maximizes the packing density of the solar cells.

The foregoing discussion discloses and describes merely exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A solar panel comprising:
   a substrate;
   a plurality of solar cells;
   circuit means including a series of electrically conductive paths formed on the substrate for electrically connecting the solar cells together to form a solar electric power supply network; and
   means for resiliently connecting the solar cells along one surface therof to the circuit means, said means for resiliently connecting including a multiplicity of electrically conductive interconnect pads being resiliently responsive to expansion and contraction of the substrate to maintain the integrity of the solar cell to circuit means connection.

2. The panel of claim 1 wherein said substrate further comprises multiple layers, including a top layer and a bottom layer, and wherein at least one said electrically conductive path is encapsulated between said top and bottom layers.

3. The panel of claim 1 wherein each said solar cell has a positive terminal and a negative terminal and said circuit means interconnects the positive terminal of a first solar cell to the negative terminal of a second solar cell.

4. The panel of claim 3 wherein said second solar cell lies coplanar with said first solar cell on said substrate.

5. The panel of claim 1 wherein each solar cell is individually removably connected to said substrate such that they can be individually replaced.

6. The panel of claim 2 wherein substantially the entire area of said substrate top layer has solar cells mounted thereto.

7. The panel of claim 2 further comprising a plurality of electrically conductive mounting areas on said substrate bottom layer for electrically connecting electrical devices to said circuit means.

8. The panel of claim 7 wherein said electrical devices comprise discrete component diodes.

9. The panel of claim 1 wherein said means for resiliently connecting further comprises discontinuities in said substrate which allow movement of said interconnect pads relative to the remainder of the substrate to thereby accommodate different thermal expansion characteristics of the solar cells and substrate.

10. The panel of claim 9 wherein said discontinues comprise arcuate slots in said substrate, surrounding the interconnect pads.

11. The panel of claim 10 further comprising a plurality of electrical traces electrically connecting said interconnect pads to said circuit means wherein said traces are formed on said substrate and wherein said interconnect pads and said traces are bounded by adjacent arcuate slots.

12. The panel of claim 11 wherein said arcuate slots in said substrate form a coil spring in the area thereof surrounding said interconnect pads.

13. The panel of claim 1 wherein said circuit means further comprises an integral bus line for conducting power collected by said solar electric power supply network to a load.

14. The panel of claim 13 wherein said substrate includes a designated portion to be punched out to break the continuity of at least one of said electrically conductive paths to form solar cell strings, each string including a preselected number of solar cells connected in electrical series.

15. A panel for mounting a plurality of electrical components thereto, said panel comprising:
a substrate;
a plurality of electrically conductive mounting pads for mounting and electrically interconnecting said components along one surface thereof to said substrate;
circuit means including a series of electrically conductive paths formed on the substrate, for electrically interconnecting said components;
a plurality of electrical traces electrically connecting said mounting pads to said circuit means; and
discontinuities in said substrate which allow movement of said mounting pads relative to the remainder of the substrate to hereby accommodate different thermal expansion characteristics of the electrical components and substrate, said discontinuities in said substrate comprising slot openings equipped with resiliently movable members adapted to receive the mounting pads.

16. The panel of claim 15 wherein said electrical components include solar cells.

17. The panel of claim 16 wherein said discontinuities comprise arcuate slots in said substrate surrounding the mounting pads.

18. The panel of claim 16 wherein said traces are formed on the substrate and wherein said mounting pads and traces are bounded by adjacent arcuate slots.

19. The panel of claim 18 wherein said slots in said substrate form a coil spring in the area thereof surrounding said mounting pads.

20. A solar panel comprising:
a substrate;
a plurality of solar cells mounted along one surface thereof to said substrate, each said solar cell being electrically, individually removably connected to said substrate via interconnect pads such that they can be individually replaced;
circuit means including a series of electrically conductive paths encapsulated within the substrate for interconnecting said solar cells to form a solar electric power supply network including discontinuities in said substrate which allow movement of the interconnect pads relative to the remainder of the substrate to thereby accommodate different thermal expansion characteristics of the solar cells and substrate;
whereby an individual solar cell may be removed from the solar panel without disturbing any adjacent cell.

* * * * *